(12) United States Patent
Yabe et al.

(10) Patent No.: US 7,768,759 B2
(45) Date of Patent: Aug. 3, 2010

(54) CONTROL CIRCUIT OF SEMICONDUCTOR DEVICE HAVING OVER-HEAT PROTECTING FUNCTION

(75) Inventors: Hiroo Yabe, Susono (JP); Kazuhiro Kubota, Susono (JP); Masato Sasahara, Susono (JP)

(73) Assignee: Yazaki Corporation, Tokyo (JP)

( * ) Notice: Subject to any disclaimer, the term of this patent is extended or adjusted under 35 U.S.C. 154(b) by 238 days.

(21) Appl. No.: 12/155,078

(22) Filed: May 29, 2008

(65) Prior Publication Data
US 2008/0310068 A1 Dec. 18, 2008

(30) Foreign Application Priority Data
Jun. 12, 2007 (JP) ............................. P2007-155456

(51) Int. Cl.
*H02H 5/04* (2006.01)
(52) U.S. Cl. ....................................... 361/93.8; 361/103
(58) Field of Classification Search ................ 361/93.8, 361/103, 106
See application file for complete search history.

(56) References Cited
U.S. PATENT DOCUMENTS
6,751,080 B2 * 6/2004 Yamaji ...................... 361/93.8
7,301,129 B1 * 11/2007 Yabe et al. ................... 219/505
2001/0038518 A1 11/2001 Yamaji

FOREIGN PATENT DOCUMENTS
JP B-3585105 11/2004

\* cited by examiner

*Primary Examiner*—Danny Nguyen
(74) *Attorney, Agent, or Firm*—Morgan, Lewis & Bockius LLP

(57) ABSTRACT

A control circuit of a semiconductor device includes: a semiconductor element which supplies an electric power to a load; an over-heat protecting unit having: a temperature detecting section which detects a rise in temperature; a latch section which holds an output of the temperature detecting section; and a gate interrupting section which interrupts an input to a gate of the semiconductor element in accordance with the output of the latch section; a control unit which supplies a PWM signal for turning on/off the semiconductor element; a driving electric power supply unit which supplies a driving electric power for driving the over-heat protecting unit; and a timer unit which allows the driving electric power supply unit to supply the driving electric power for a predetermined period when the input to the gate of the semiconductor element is interrupted and the control unit stops to supply the PWM signal.

4 Claims, 8 Drawing Sheets

CONTROL CIRCUIT OF SEMICONDUCTOR DEVICE HAVING OVER-HEAT PROTECTING FUNCTION

BACKGROUND OF THE INVENTION

1. Technical Field

The present invention relates to a control circuit of a semiconductor device having an over-heat protecting function suitable for preventing, due to an over-heat, a damage of a semiconductor element for a large electric power used for driving, for instance, a lamp of a motor vehicle.

2. Background Art

As the control circuit of a semiconductor device having an over-heat protecting function, JP-B-3585105 discloses a device that can reduce a possibility of breaking the semiconductor device. This device includes, as shown in FIG. 6, a CPU 1, an amplifying circuit 2, a semiconductor device 3 having an over-heat protecting function for turning on/off a driving of a load 4 and an output state detecting part 5.

The CPU 1 internally generates (or fetches from an external signal source not shown in the drawing) a control signal for controlling the semiconductor device 3 having the over-heat protecting function, for instance, a PWM (Pulse Width Modulation) control signal and outputs the control signal from an output port P1. The amplifying circuit 2 is a push-pull type amplifying circuit including a plurality of transistors and a plurality of resistances.

The semiconductor device 3 having the over-heat protecting function includes a MOSFET 3a of N ch, a gate resistance 3b connected between the gate of the MOSFET 3a and a gate terminal G, a temperature detecting circuit 3c connected between the source of the MOSFET 3a and a source terminal S, a latch circuit 3d for latching a temperature detecting output of the temperature detecting circuit 3c and a gate interrupting circuit 3e connected between the gate and the source of the MOSFET 3a and controlled by the output of the latch circuit 3d. The above-described circuits and the members are mounted on one chip.

The drain of the MOSFET 3a is connected to a drain terminal D connected to a +B power source and the source is connected to the source terminal S. Then, the over-heat protecting function of the semiconductor device 3 is realized by the cooperation of the gate resistance 3b, the temperature detecting circuit 3c, the latch circuit 3d and the gate interrupting circuit 3e.

The load 4 designates, for instance, a lamp used for a winker (a flasher) showing a turn signal in a vehicle. The output state detecting part 5 supplies a detected output of an output state to an input port P2 of the CPU 1.

In the above-described structure, when the PWM control signal outputted from the output port P1 of the CPU 1 is amplified in the amplifying circuit 2, and supplied to the gate of the MOSFET 3a to carry out a PWM control, the CPU 1 detects, through the output state detecting part 5, the output voltage of the MOSFET 3a, that is, a source voltage of the MOSFET 3a relative to the continuous rise and fall of the PWM control signal at a monitoring timing at intervals of a rise time tG (ON)+a prescribed time ts (in this case, ts<tG (OFF)−tG (ON)).

At this time, when the state of the load 4 is normal, the source voltage rises at each rise time tG (ON) of the gate voltage of the MOSFET 3a by the PWM control signal, and falls at each fall time tG (OFF), so that the source voltage has the same wave form as that of the gate voltage. Accordingly, when the CPU 1 detects a source output state in accordance with a detecting output from the output state detecting part 5 at the monitoring timing of tG (ON)+ts from each rise, Hi (that is, a logic 1) is obtained.

On the other hand, when an abnormality, for instance, a short-circuit arises in the load 4, the MOSFET 3a is over-heat interrupted by the cooperation of the temperature detecting circuit 3c, the latch circuit 3d and the gate interrupting circuit 3e. Thus, the source voltage of the MOSFET 3a has wave forms falling at timings gradually shorter from the rise time tG(ON) of the gate voltage every protecting operation. Accordingly, when the CPU 1 detects a source output state in accordance with a detecting output from the output state detecting part 5 at the monitoring timing of tG (ON)+ts from each rise, Lo (that is, a logic 0) is obtained.

Then, when the CPU 1 detects that the source output state is Lo (that is, a logic 0) continuously m times or for n seconds at each monitoring timing, the CPU 1 does not supply the PWM control signal to the output port P1 to stop the PWM control of the MOSFET 3a. The above-described m times or the n seconds are set to the number of times or a time that can sufficiently avoid the MOSFET 3a from being broken. As a result, a current is not supplied between the drain and the source of the MOSFET 3a to prevent the damage of the MOSFET 3a due to the rise of a temperature.

In JP-B-3585105, when the abnormality such as the short-circuit arises in the load 4, and the MOSFET 3a is over-heat interrupted by the cooperation of the temperature detecting circuit 3c, the latch circuit 3d and the gate interrupting circuit 3e, the CPU 1 detects that the source output state obtained through the output state detecting part 5 is Lo (that is, a logic 0) continuously m times or for n seconds at each monitoring timing to stop the PWM control of the MOSFET 3a for the purpose of a protecting operation. Therefore, a problem arises that a circuit is complicated and enlarged.

Further, when it is decided whether or not the protecting operation is carried out, an operation that the MOSFET 3a is turned on again to be over-heat interrupted needs to be repeated several times. Thus, a problem also arises that the deterioration of the MOSFET 3a may possibly advance.

Further, a vehicle has a load 4 such as a hazard lamp that is driven not only when an ignition switch is turned on, but also when the ignition switch is turned off. A circuit structure in this case is shown in, for instance, FIG. 7.

FIG. 7 shows the structure that a power circuit 6 and a PWM turning on switch 7 for turning on the load 4 such as the hazard lamp are added to the circuit structure shown in FIG. 6. In FIG. 7, a CPU 1 and the power circuit 6 are turned off so as not to consume an electric power when the ignition switch not shown in the drawing is turned off. Here, when the ignition switch is turned off, if the PWM turning on switch 7 is turned on, the electric power from the power circuit 6 is supplied to the CPU 1 and an amplifying circuit 2 so that the load 4 is driven by the PWM control of the CPU 1.

In such a structure, when an abnormal state arises, for instance, the load 4 is short-circuited, a MOSFET 3a is over-heat interrupted by the cooperation of a temperature detecting circuit 3c, a latch circuit 3d and a gate interrupting circuit 3e. At this time, as shown in a timing chart of FIG. 8, the source voltage of the MOSFET 3a has wave forms falling at timings gradually shorter from the rise time of the gate voltage every protecting operation.

Then, the CPU 1 detects that a source output state obtained through an output state detecting part 5 is Lo (that is, a logic 0) continuously m times or for n seconds to stop the PWM control of the MOSFET 3a. After the PWM control is stopped, when the PWM turning on switch 7 is turned on/off, the operation of the CPU 1 is reset by turning off a power source.

When the operation of the CPU 1 is reset as described above, an over-heat interrupting operation is repeated in such a way that while the temperature of the MOSFET 3a is high, the load 4 is driven again by the PWM control from the CPU 1, then, an over-heat interruption is immediately carried out, or while an over-heat protecting operation is detected, the PWM turning on switch 7 is turned off and then, turned on again. Thus, a problem arises that the MOSFET 3a may be possibly broken.

SUMMARY OF THE INVENTION

The present invention is devised by considering the above-described circumstances and it is an object to provide a control circuit of a semiconductor device having an over-heat protecting function that can solve the above-described problems.

According to the present invention, there is provided a control circuit of a semiconductor device having an over-heat protecting function, including:

a semiconductor element which supplies an electric power from a power source to a load;

an over-heat protecting unit for protecting an over-heat inside the semiconductor device, the over-heat protecting unit having:

a temperature detecting section which detects a rise in temperature of the semiconductor device;

a latch section which holds a detected output of the temperature detecting section; and a gate interrupting section which interrupts an input to a gate of the semiconductor element in accordance with the output of the latch section;

a control unit which supplies a PWM signal for turning on/off the semiconductor element;

a driving electric power supply unit which supplies a driving electric power for driving the over-heat protecting unit; and a timer unit which allows the driving electric power supply unit to supply the driving electric power for a predetermined period when the gate interrupting section interrupts the input to the gate of the semiconductor element and the control unit stops to supply the PWM signal to the semiconductor element.

Preferably, the control circuit further includes: a current detecting section which detects a current supplied to the semiconductor element to output a current detecting signal when the value of the current exceeds a predetermined threshold value; a logic gate that outputs logical addition of the current detecting signal and the PWM signal; and a driving section which drives the semiconductor element in accordance with the logical addition output by the logic gate.

Preferably, the control unit supplies the PWM signal to the semiconductor element in accordance with a turning on/off operation of a switch.

Preferably the semiconductor element and the over-heat protecting unit are formed on one chip.

In the control circuit of the semiconductor device having the over-heat protecting function according to the present invention, the semiconductor element that supplies the electric power from the +B power source to the load is turned on/off by the PWM signal from the control unit. From the driving electric power supply unit, the driving electric power is supplied for driving the over-heat protecting unit that includes the temperature detecting circuit for detecting the rise of the temperature of one chip, the latch circuit for holding the detected output of the temperature detecting circuit and the gate interrupting circuit for interrupting the input of the gate of the semiconductor element in accordance with the output of the latch circuit, which are mounted on the one chip. Thus, the temperature detecting circuit of the over-heat protecting unit operates to turn on the gate interrupting circuit. Then, when the protecting operation is carried out by interrupting the gate of the semiconductor element and the control unit does not supply the PWM signal, the supply of the driving electric power by the driving electric power supply unit is continuously carried out only for a predetermined period by the timer unit.

According to the control circuit of the semiconductor device having the over-heat protecting function of the present invention, when the temperature detecting circuit of the over-heat protecting unit operates to turn on the gate interrupting circuit, then, the protecting operation is carried out by interrupting the gate of the semiconductor element and the control unit does not supply the PWM signal, the supply of the driving electric power by the driving electric power supply unit is continuously carried out only for a prescribed period by the timer unit. Accordingly, since the structure that the output state of the semiconductor element is fetched to decide whether or not the protecting operation is carried out to stop the PWM control of the semiconductor element is not required as usual, the circuit can be simplified and made to be compact.

Further, according to the control circuit of the semiconductor device having the over-heat protecting function of the present invention, when the temperature detecting circuit of the over-heat protecting unit operates to turn on the gate interrupting circuit, and then, the protecting operation is carried out by interrupting the gate of the semiconductor element, the supply of the driving electric power by the driving electric power supply unit is continuously carried out only for a prescribed period by the timer unit. Accordingly, the interruption of the gate by the gate interrupting circuit of the over-heat protecting unit is maintained, and the operations of several times are not required as usual for turning on again and over-heat interrupting the semiconductor element, so that the deterioration of the semiconductor element can be prevented.

Further, according to the control circuit of the semiconductor device having the over-heat protecting function of the present invention, when the temperature detecting circuit of the over-heat protecting unit operates to turn on the gate interrupting circuit, and then, the protecting operation is carried out by interrupting the gate of the semiconductor element, the supply of the driving electric power by the driving electric power supply unit is continuously carried out only for a prescribed period by the timer unit to maintain the interruption of the gate by the gate interrupting circuit of the over-heat protecting unit. Accordingly, when the interruption of the gate is maintained, even if a change arises in the PWM signal from the control unit, the semiconductor element is not turned on. Thus, a situation can be prevented that while the temperature of the semiconductor element is high, the semiconductor element is turned on again and then broken.

BRIEF DESCRIPTION OF THE DRAWINGS

The above objects and advantages of the present invention will become more apparent by describing in detail preferred exemplary embodiments thereof with reference to the accompanying drawings, wherein like reference numerals designate like or corresponding parts throughout the several views, and wherein.

DETAILED DESCRIPTION OF THE PREFERRED EMBODIMENTS

Figure 1:
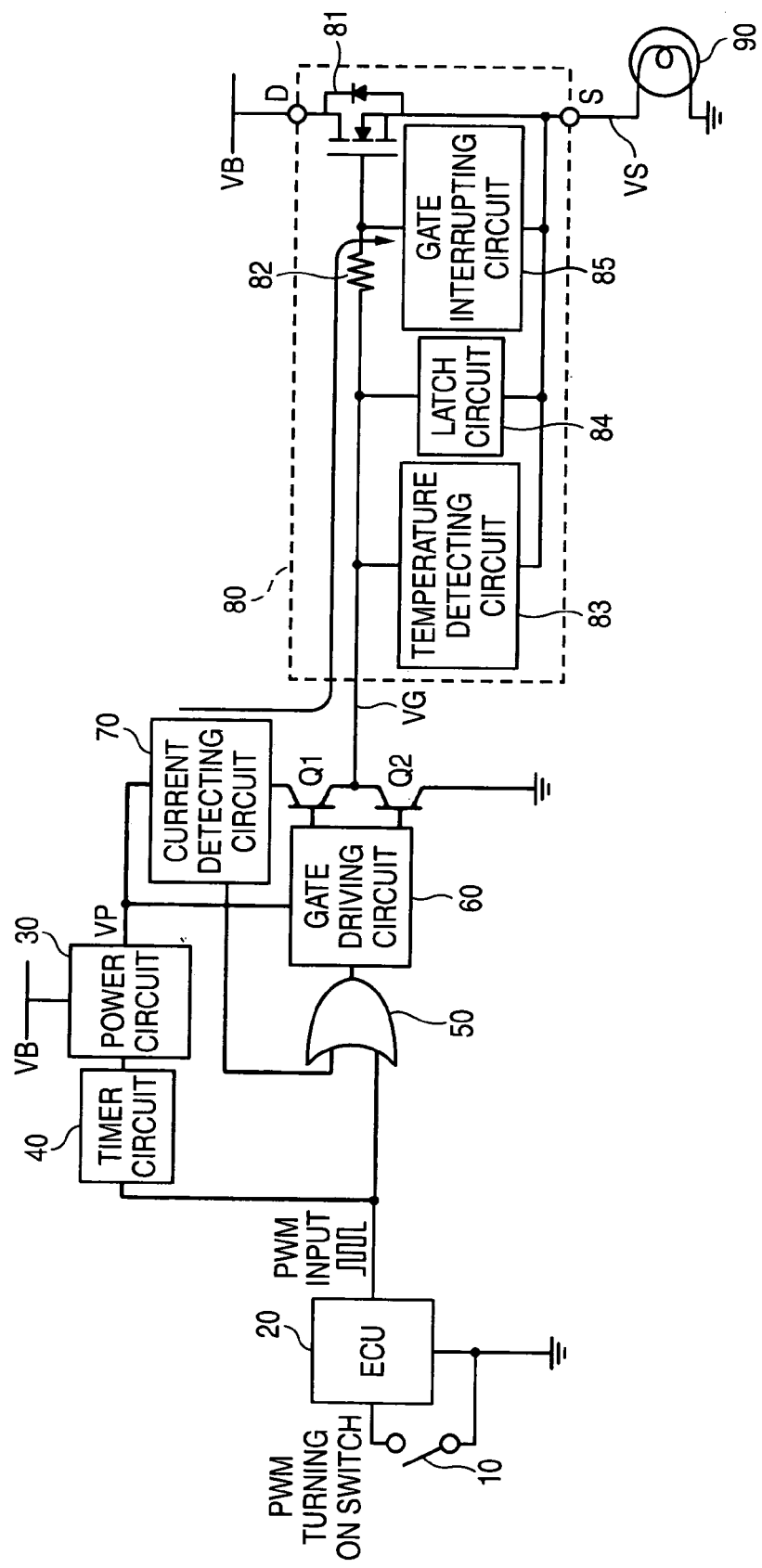
FIG. 1 is a diagram for explaining one embodiment of a control circuit of a semiconductor device having an over-heat protecting function according to the present invention.

In this embodiment, the semiconductor element that supplies the electric power from the +B power source to the load is turned on/off by the PWM signal form the control unit. From the driving electric power supply unit, the driving electric power is supplied for driving the over-heat protecting unit that includes the temperature detecting circuit for detecting the rise of the temperature of the one chip, the latch circuit for holding the detected output of the temperature detecting circuit and the gate interrupting circuit for interrupting the input of the gate of the semiconductor element in accordance with the output of the latch circuit, which are mounted on the one chip. Thus, the temperature detecting circuit of the over-heat protecting unit operates to turn on the gate interrupting circuit. Then, when the protecting operation is carried out by interrupting the gate of the semiconductor element and the control unit does not supply the PWM signal, the supply of the driving electric power by the driving electric power supply unit is continuously carried out only for a prescribed period by the timer unit.

In this case, when a current detecting circuit detects a current supplied to the semiconductor element and the value of the current exceeds a prescribed threshold value, the current detecting circuit outputs a detecting signal. When a logic gate outputs an OR (logical addition) of the detecting signal of the current detecting circuit and the PWM signal from the control unit, a driving circuit drives the semiconductor element in accordance with an output of the logic gate.

Thus, when the temperature detecting circuit of the over-heat protecting unit operates to turn on the gate interrupting circuit, then, the protecting operation is carried out by interrupting the gate of the semiconductor element and the control unit does not supply the PWM signal, the supply of the driving electric power by the driving electric power supply unit is continuously carried out only for a prescribed period by the timer unit. Accordingly, since the structure of a usual example is not required in which the output state of the semiconductor element is fetched to decide whether or not the protecting operation is carried out and to stop the PWM control of the semiconductor element, the circuit can be simplified and made to be compact.

Further, when the temperature detecting circuit of the over-heat protecting unit operates to turn on the gate interrupting circuit, and then, the protecting operation is carried out by interrupting the gate of the semiconductor element, the supply of the driving electric power by the driving electric power supply unit is continuously carried out only for a prescribed period by the timer unit. Accordingly, the interruption of the gate by the gate interrupting circuit of the over-heat protecting unit is maintained, and the operations of several times as performed in a usual example are not required for turning on again and over-heat interrupting the semiconductor element, so that the deterioration of the semiconductor element can be prevented.

Further, when the temperature detecting circuit of the over-heat protecting unit operates to turn on the gate interrupting circuit, and then, the protecting operation is carried out by interrupting the gate of the semiconductor element, the supply of the driving electric power by the driving electric power supply unit is continuously carried out only for a prescribed period by the timer unit to maintain the interruption of the gate by the gate interrupting circuit of the over-heat protecting unit. Accordingly, when the interruption of the gate is maintained, even if a change arises in the PWM signal from the control unit, the semiconductor element is not turned on. Thus, a situation can be prevented that while the temperature of the semiconductor element is high, the semiconductor element is turned on again and then broken.

Embodiment

Now, embodiments of the present invention will be described below in detail. FIG. 1 is a diagram for explaining one embodiment of a control circuit of a semiconductor device having an over-heat protecting function according to the present invention.

The control circuit of the semiconductor device having the over-heat protecting function shown in FIG. 1 includes an ECU (Engine Control Unit) 20, a power circuit 30, a timer circuit 40, an OR gate 50, a gate driving circuit 60 and a current detecting circuit 70.

In the drawing, reference numeral 10 designates a PWM turning on switch and 90 designates, for instance a hazard lamp driven not only when an ignition switch is turned on, but also when the ignition switch is turned off. Reference numeral 80 designates the semiconductor device having the over-heat protecting function.

The ECU outputs a PWM (Pulse Width Modulation) signal with a predetermined duty ratio in accordance with an operation of the PWM turning on switch 10.

The power circuit 30 is turned on in accordance with a signal from the timer circuit 40 to supply a VP power to the circuits respectively. The timer circuit 40 is turned on in accordance with the PWM signal from the ECU 20 and outputs a signal for turning on the power circuit 30 for a predetermined time even when the PWM signal is turned off.

The OR gate 50 supplies an OR logic output of the PWM signal from the ECU 20 and a detecting signal from the current detecting circuit 70 to the gate driving circuit 60. The gate driving circuit 60 has transistors Q1 and Q2 to turn on/off the transistors Q1 and Q2 in accordance with the OR logic output from the OR gate 50.

Here, the OR gate 50 is used to supply the OR logic output of the PWM signal from the ECU 20 and the detecting signal from the current detecting circuit 70 to the gate driving circuit 60, however, the present invention is not limited thereto and it is to be understood that other logic gates such as an AND gate or a NAND gate may be used. When other logic gates are used, peripheral circuits of these logic gates may be arranged so as to obtain a desired logic output.

The current detecting circuit 70 detects a current IG supplied to a gate terminal of a below-described MOSFET 81 of the semiconductor device 80 having the over-heat protecting function and outputs Hi when the value of the current IG exceeds a prescribed threshold value.

The semiconductor device 80 having the over-heat protecting function includes the MOSFET 81 of N ch, a gate resistance 82 connected between the gate of the MOSFET 81 and a gate terminal G, a temperature detecting circuit 83 connected between the source of the MOSFET 81 and a source terminal S, a latch circuit 84 for latching a temperature detecting output of the temperature detecting circuit 83 and a gate interrupting circuit 85 connected between the gate and the source of the MOSFET 81 and controlled by the output of the latch circuit 84. The above-described circuits and the members are mounted on one chip. The drain of the MOSFET 81 is connected to a drain terminal D connected to a +B power source and the source of the MOSFET 81 is connected to the source terminal S. Then, the over-heat protecting function of the semiconductor device 80 is realized by the cooperation of the gate resistance 82, the temperature detecting circuit 83, the latch circuit 84 and the gate interrupting circuit 85.

Figure 2:
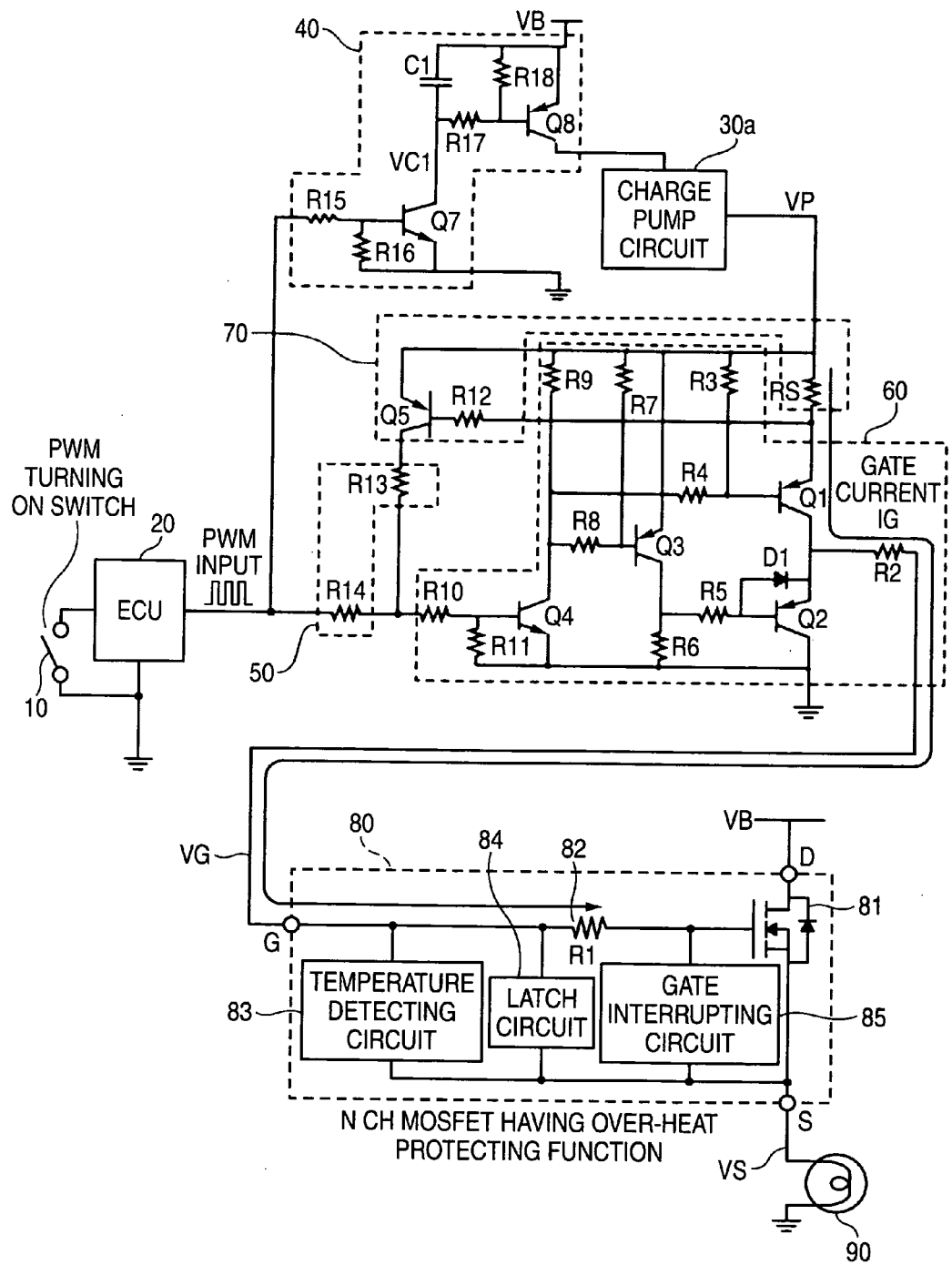
FIG. 2 is a circuit diagram showing a specific structure of the control circuit of the semiconductor device having the over-heat protecting function of FIG. 1.

FIG. 2 is a circuit diagram showing a specific structure of the above-described control circuit of the semiconductor device having the over-heat protecting function. As shown in FIG. 2, the gate driving circuit 60 includes transistors Q1 to Q4, resistances R2 to R11 and a diode D1.

Here, when the PWM signal from the ECU 20 is high to turn on the transistor Q4, the collector voltage of the transistor Q4 is low to turn on the transistor Q1. Accordingly, a gate current IG is supplied to a path of a resistance Rs, the emitter-collector of the transistor Q1 and the resistance R2 from a VP power source so that the gate of the MOSFET 81 is charged through a resistance R1. Thus, when a voltage Vgs between the gate and the source of the MOSFET 81 rises and the voltage exceeds a threshold value, the MOSFET 81 is turned on.

Further, since the transistor Q1 is turned on and the transistor Q3 is also turned on at the same time, the base voltage of the transistor Q2 is raised to turn off the transistor Q2. The diode D1 is provided for protecting the base of the transistor Q2.

On the other hand, when the PWM signal from the ECU 20 is low, the transistor Q4 is turned off, the collector voltage of the transistor Q4 has a value of the VP power source and the transistors Q1 and Q3 are turned off. When the transistor Q3 is turned off, the base of the transistor Q2 is low, and the emitter of the transistor Q2 is also low. Thus, an electric charge is discharged to a ground through the resistance R2 and the emitter-collector of the transistor Q2 from the gate of the MOSFET 81.

At this time, when the voltage Vgs between the gate and the source of the MOSFET 81 falls and the voltage is lower than the threshold value, the MOSGET 81 is turned off. The above-described operations are repeated to supply an electric power from a +B power source to the load 90 in accordance with a PWM control.

The current detecting circuit 70 includes a transistor Q5 and resistances Rs and R12. Namely, when the gate current IG passing through the resistance Rs is increased so that the voltage drop of the resistance Rs reaches about 0.7V, the transistor Q5 is turned on and the collector voltage of the transistor Q5 is high.

The OR gate 50 includes resistances R13 and R14. A charge pump circuit 30a serves as the power circuit 30 to generate a voltage of the VP power source=VB(+B power source)+10 V.

The timer circuit 40 includes transistors Q7 and Q8, resistances R15 to R18 and a capacitor C1. Namely, when the PWM signal is high, the transistor Q7 is turned on and the potential VC1 of the capacitor C1 is lowered to charge the capacitor C1.

Here, while the potential VC1 is lower than an operating threshold value of the transistor Q8 set by the resistances R17 and R18, the transistor Q8 is turned on. Thus, even when the PWM signal is low, the supply of the VP power source is carried out for some time.

Figure 3:
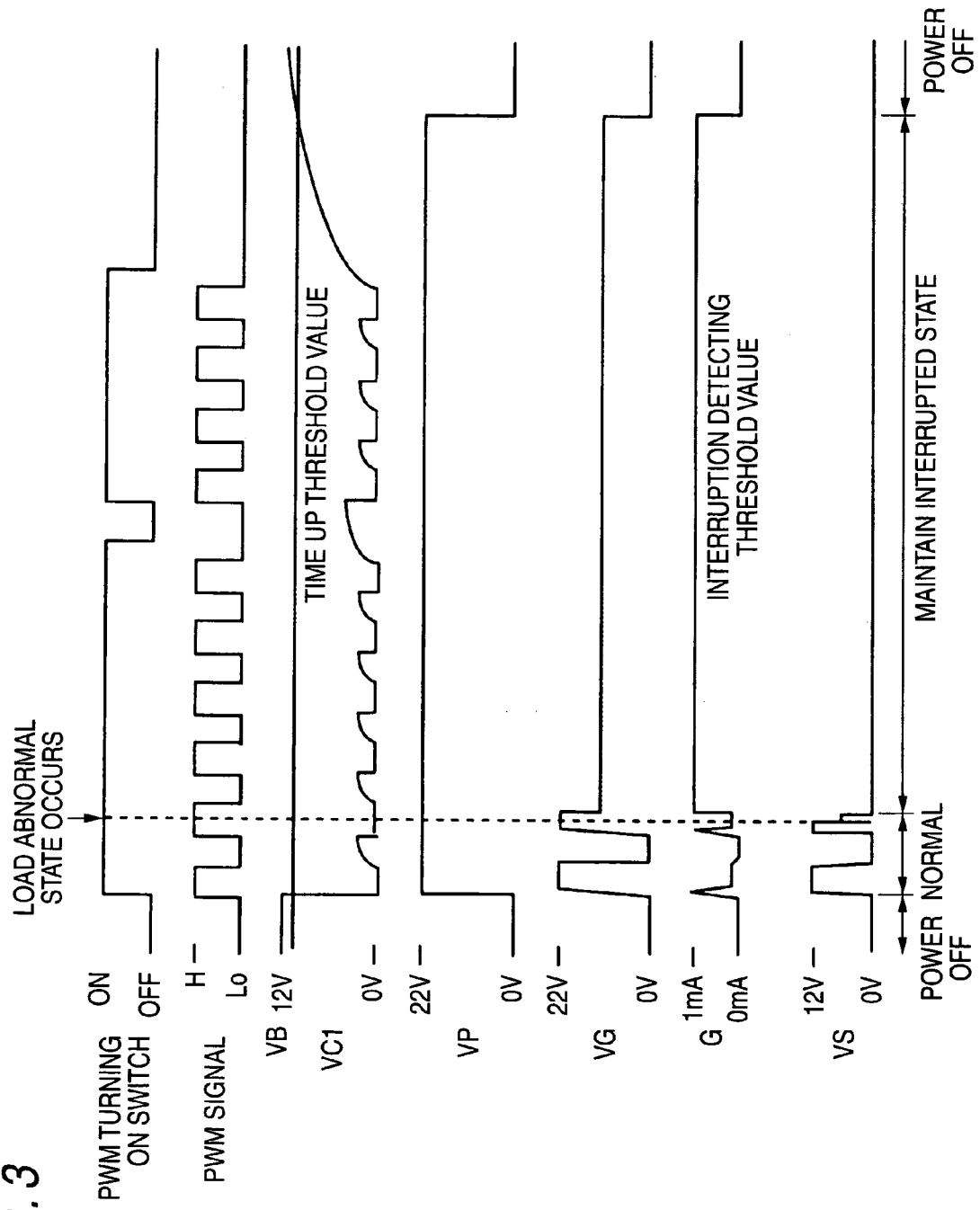
FIG. 3 is a timing chart for explaining a protecting operation of a MOSFET shown in FIG. 1.

Now, a protecting operation of the MOSFET 81 will be described below. FIG. 3 is a timing chart for explaining the protecting operation. In FIG. 3, VB (+B power source) is set to 12 V and the VP power source is set to 22 V. Further, the above-described resistances R1, R2 and Rs are respectively set to R1=10 kΩ, R2=10 kΩ and Rs=1.2 kΩ.

Specifically, when the PWM turning on switch 10 is turned on and the PWM signal from the ECU 20 is high, the above-described transistor Q7 is turned on to charge the capacitor C1 and the potential VC1 is low. Thus, the transistor Q8 is turned on to activate the charge pump circuit 30a and the VP power source is set to 22V.

On the other hand, when the above-described transistor Q4 is turned on and the transistor Q1 is turned on, the output of the gate driving circuit 60 is high, the gate voltage VG of the MOSFET 81 rises to about 22V and the source voltage of the MOSFET 81 rises to about 12V.

In accordance therewith, the gate current IG flows to turn on the MOSFET 81 and a driving current from the +B power source is supplied to the load 90. When the MOSFET 81 begins to be turned on, a charging current of about 1 mA is supplied to the gate for several micro seconds to several ten micro seconds. Thus, the voltage drop of the resistance Rs reaches 0.7 V or more during that period and the output (the collector of the transistor Q5) of the current detecting circuit 70 is high. However, during this period, since the PWM signal is originally high, the turning on operation of the MOSFET 81 is not affected.

Further, when the PWM signal from the ECU 20 is low, the output of the gate driving circuit is also low to turn off the MOSFET 81 and VS falls to 0V. At this time, the transistor S7 is tuned off, however, the potential VC1 of the capacitor C1 remains to be low for some time. Thus, the transistor Q8 is turned on and the value of the VP power source remains to be 22V. Further, since when a gate output is low, the current detecting circuit 70 does not operate, the current detecting output remains to be low.

Here, the interruption of the MOSFET 81 due to an over-heat arises when the MOSFET 81 is turned on. At the time of turning off the MOSFET 81, if the MOSFET 81 is externally heated and the temperature exceeds a threshold value, only when a voltage of the operating threshold value or higher is applied to the gate of the MOSFET 81, the temperature detecting circuit 83 of the MOSFET 81 operates to interrupt the MOSFET 81.

When the temperature detecting circuit 83 of the MOSFET 81 operates to turn on the gate interrupting circuit 85, since a part between the inner gate and the source of the MOSFET 81 is short-circuited, the gate current IG of about 1 mA is supplied and the gate voltage VG falls to about 10V.

Subsequently thereto, since the gate charge of the MOSFET 81 is pulled out, the MOSFET 81 is turned off. At this time, the gate current IG of about 1 mA is supplied, so that the voltage drop of the resistance Rs is 0.7 V or higher and the output of the current detecting circuit 70 is high.

Under this state, even when the PWM signal from the ECU is lowered to be low, since the value of the VP power source is maintained to be 22V, the gate driving circuit 60 continuously emits a high output in accordance with an OR logic with the high output of the current detecting circuit 70.

Therefore, the gate current IG of about 1 mA is continuously supplied to the MOSFET 81 so that the MOSFET 81 maintains an interrupting operation. Similarly, even when a change arises in the PWM signal after that, the interruption of the MOSFET 81 is maintained.

Here, when a period during which the PWM signal from the ECU is low exceeds a set time, the potential VC1 of the capacitor C1 is higher than the voltage of the operating threshold value of the transistor Q8, so that the transistor Q8 is turned off and the charge pump circuit 30a is stopped. Thus, the value of the VP power source is 0V and the gate voltage VG is also low so that the over-heat interruption is not maintained.

However, since the temperature of the MOSFET 81 falls during a timer period, even when the PWM signal is inputted again to interrupt the MOSFET 81 due to the over-heat, there is only the slightest possibility that the storage of heat due to the rise from the already raised temperature arises like a usual case and the MOSFET 81 is broken.

The timer period may be at least longer than a PWM period, however, in order to improve a reliability, may be set to a time sufficient for the temperature at which the MOSFET 81 is interrupted due to the over-heat returns to a temperature in the periphery of the device.

As described above, in this embodiment, the MOSFET 81 as the semiconductor element that supplies the electric power from the +B power source to the load is turned on/off by the PWM signal from the ECU 20 as the control unit. From the power circuit 30 as the driving electric power supply unit, the driving electric power is supplied for driving the over-heat protecting unit that includes the temperature detecting circuit 83 for detecting the rise of the temperature of the one chip, the latch circuit 84 for holding the detected output of the temperature detecting circuit 83 and the gate interrupting circuit 85 for interrupting the input of the gate of the MOSFET 81 in accordance with the output of the latch circuit 84, which are mounted on the one chip. Thus, the temperature detecting circuit 83 of the over-heat protecting unit operates to turn on the gate interrupting circuit 85. Then, when the protecting operation is carried out by interrupting the gate of the MOSFET 81 and the ECU 20 does not supply the PWM signal, the supply of the driving electric power by the power circuit 30 is continuously carried out only for a prescribed period by the timer circuit 40 as the timer section.

In this case, when the current detecting circuit 70 detects the gate current IG supplied to the MOSFET 81 and the value of the current exceeds a prescribed threshold value, the current detecting circuit outputs a detecting signal. When the OR gate 50 as the logic gate outputs an OR (logical addition) of the detecting signal of the current detecting circuit 70 and the PWM signal from the ECU 20, the gate driving circuit 60 as the driving circuit drives the MOSFET 81 in accordance with the output of the OR gate 50.

Thus, when the temperature detecting circuit 83 of the over-heat protecting unit operates to turn on the gate interrupting circuit 85, then, the protecting operation is carried out by interrupting the gate of the MOSFET 81 and the ECU 20 does not supply the PWM signal, the supply of the driving electric power by the power circuit 30 is continuously carried out only for a prescribed period by the timer circuit 40.

Accordingly, since the structure of a usual example is not required in which the output state of the semiconductor element is fetched to decide whether or not the protecting operation is carried out and to stop the PWM control of the semiconductor element, the circuit can be simplified and made to be compact.

Further, when the temperature detecting circuit 83 of the over-heat protecting unit operates to turn on the gate interrupting circuit 85, and then, the protecting operation is carried out by interrupting the gate of the MOSFET 81, the supply of the driving electric power by the power circuit 30 is continuously carried out only for a prescribed period by the timer circuit 40. Accordingly, the interruption of the gate by the gate interrupting circuit 85 of the over-heat protecting unit is maintained, and the operations of several times as performed in a usual example are not required for turning on again and over-heat interrupting the semiconductor element, so that the deterioration of the MOSFET 81 can be prevented. In this case, when the deterioration of the MOSFET 81 is prevented, the reliability of the MOSFET 81 can be improved.

Further, when the temperature detecting circuit 83 of the over-heat protecting unit operates to turn on the gate interrupting circuit 85, and then, the protecting operation is carried out by interrupting the gate of the MOSFET 81, the supply of the driving electric power by the power circuit 30 is continuously carried out only for a prescribed period by the timer circuit 40 to maintain the interruption of the gate by the gate interrupting circuit 85 of the over-heat protecting unit. Accordingly, when the interruption of the gate is maintained, even if a change arises in the PWM signal from the ECU 20, the MOSFET 81 is not turned on. Thus, a situation can be prevented that while the temperature of the MOSFET 81 is high, the MOSFET 81 is turned on again and then broken.

Namely, in this embodiment, since an interrupting and latching function originally provided in the over-heat protecting unit is effectively used to carry out the protecting operation, it can be said that such a control is not necessary to detect that the source output state obtained through the output state detecting part is low (that is, a logic 0) continuously m times or for n seconds as in the usual and to stop the PWM control of the MOSFET.

Further, in this embodiment, since the PWM control is carried out by the ECU 20 that does not receive the influence of a disturbance noise, a situation does not arise that the electric power is received from the power circuit to receive the influence of the disturbance noise like the usual CPU, and an erroneous interruption of the MOSFET 81 or the malfunction of the load 90 occurs.

Further, in this embodiment, since the PWM signal is supplied from the ECU 20 in accordance with the operation of the PWM turning on switch 10, even when the structure of this embodiment is applied to the load 90 such as the hazard lamp driven, for instance, when an ignition switch is turned off, the supply of the electric power from the power circuit 30 is held for a prescribed time by the timer circuit 40. Thus, while the protecting operation is carried out, the MOSFET 81 is not repeatedly turned on/off and the acceleration of the deterioration of the MOSFET 81 is suppressed.

As described above, in this embodiment, the output of the current detecting circuit 70 is used to protect the over-heat of the semiconductor device 80 for driving the load such as the hazard lamp, however, the present invention is not limited thereto and the output of the current detecting circuit 70 may be outputted to an external ECU of other electrical system or a driving system to be used for other control.

Figure 4:
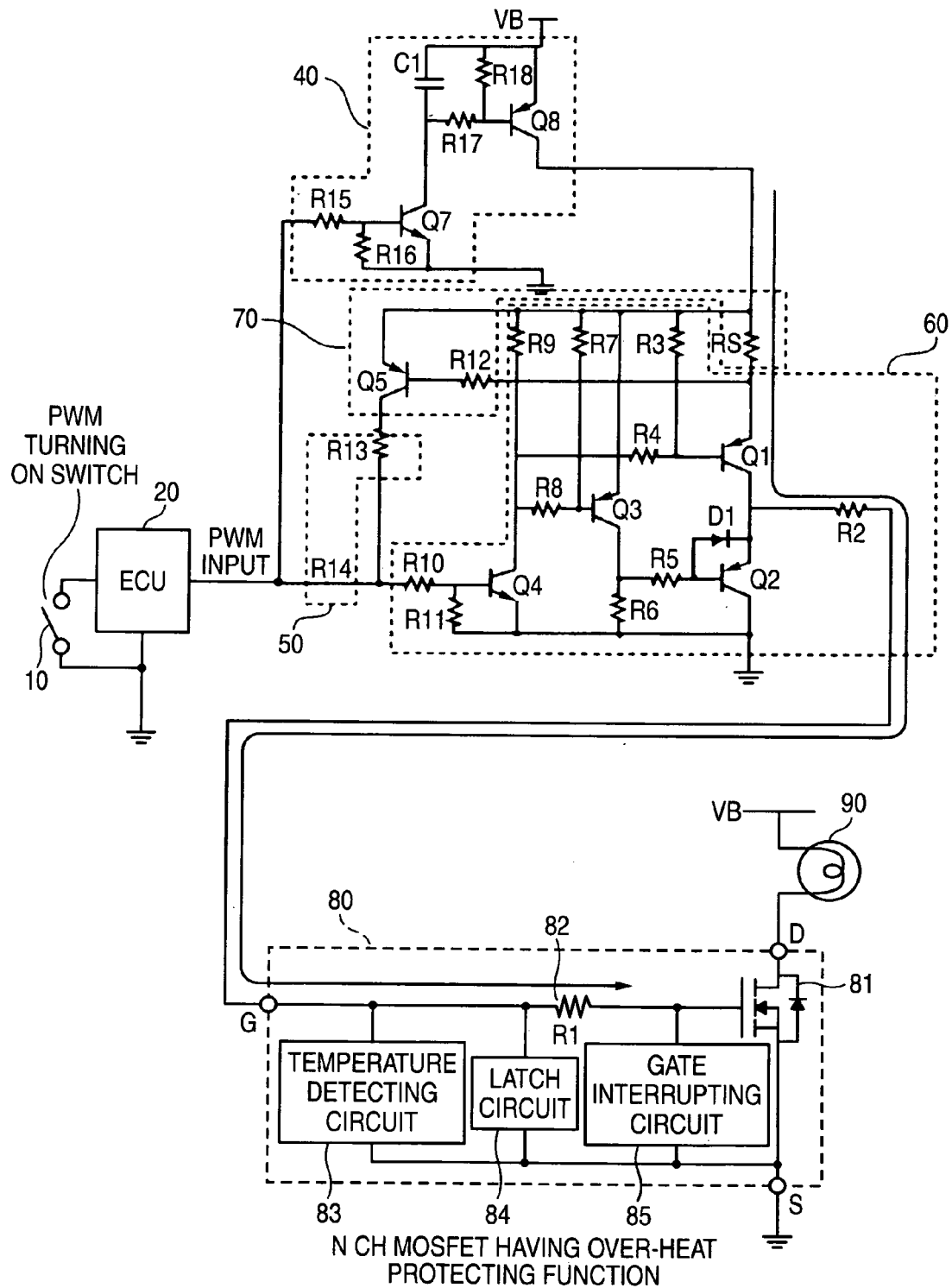
FIG. 4 is a diagram for explaining another embodiment of the control circuit of the semiconductor device having the over-heat protecting function shown in FIG. 1.

Further, in this embodiment, an example is described that the semiconductor device 80 having the over-heat protecting function is provided in an upstream side of the load 90, however, the present invention is not limited to this example. As shown in FIG. 4, what is called a low side switching circuit structure may be employed in which the semiconductor device 80 having the over-heat protecting function is provided in a downstream side of the load 90.

In this case, since the MOSFET 81 serves to turn on/off the supply of a current to the load 90 from the +B power source, the charge pump circuit 30a is not required and the transistor Q8 can serve as both the output of the timer circuit 40 and the power circuit 30.

Figure 5:
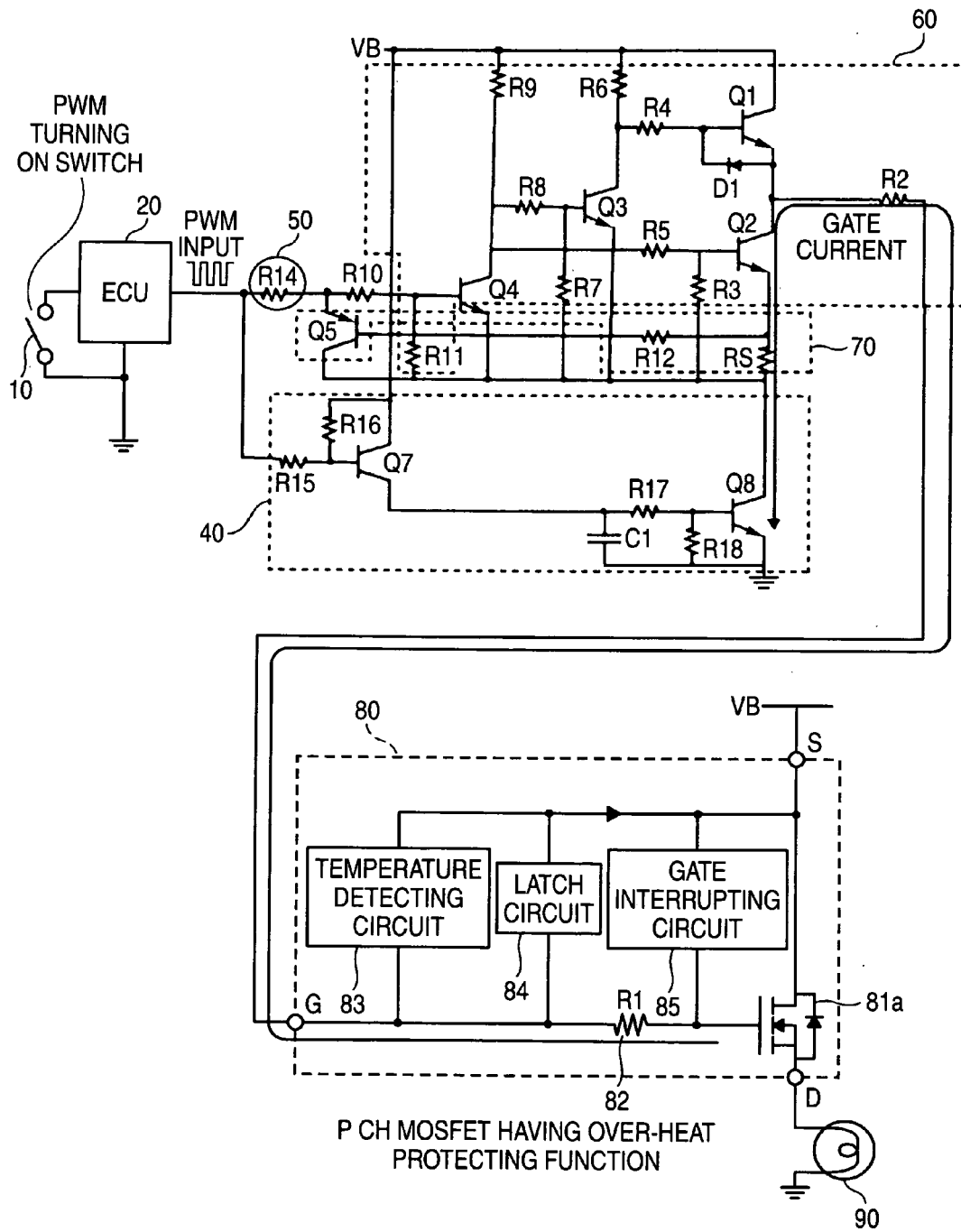
FIG. 5 is a diagram for explaining another embodiment of the control circuit of the semiconductor device having the over-heat protecting function shown in FIG. 1.
Figure 6:
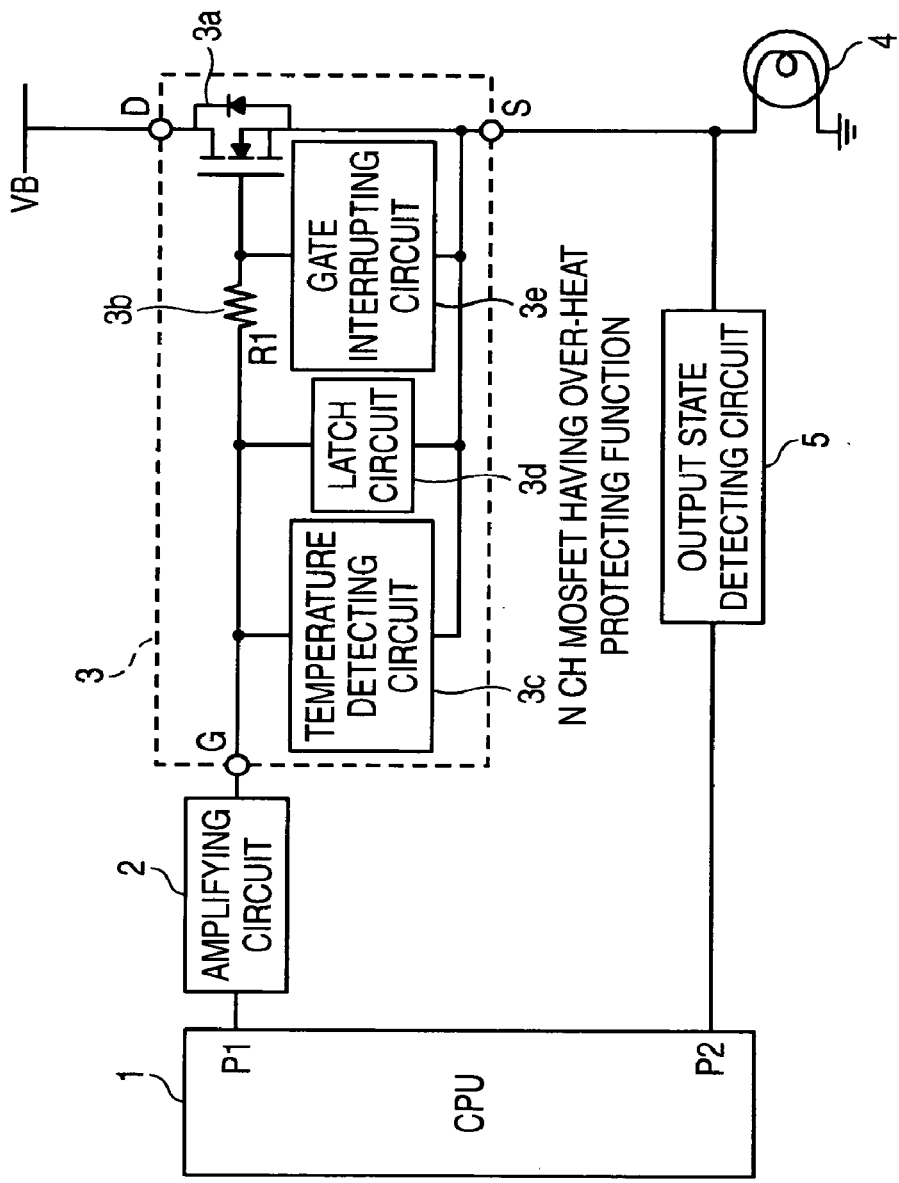
FIG. 6 is a diagram for explaining one example of a usual control circuit of a semiconductor device having an over-heat protecting function.
Figure 7:
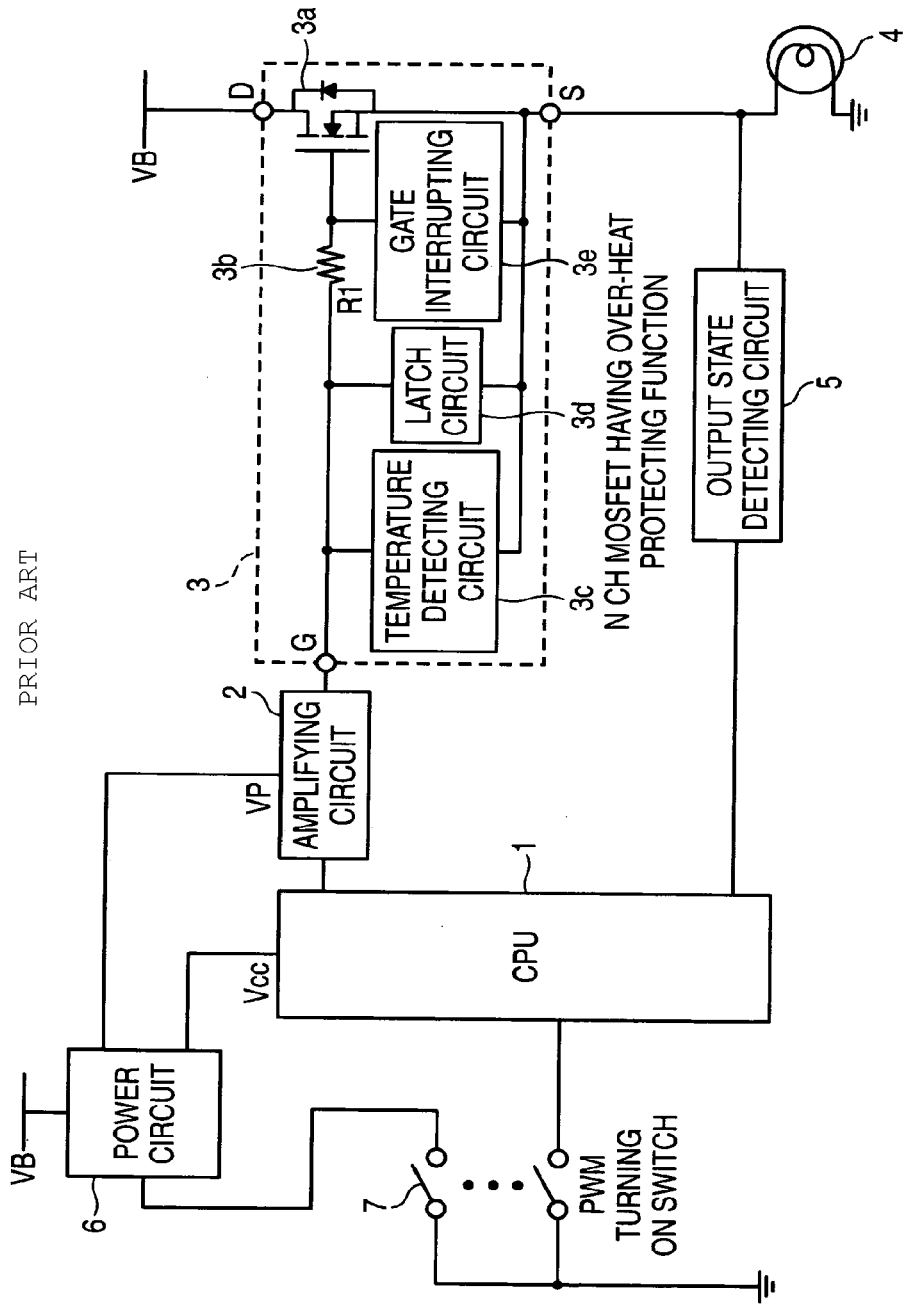
FIG. 7 is a diagram for explaining another example of a usual control circuit of a semiconductor device having an over-heat protecting function.
Figure 8:
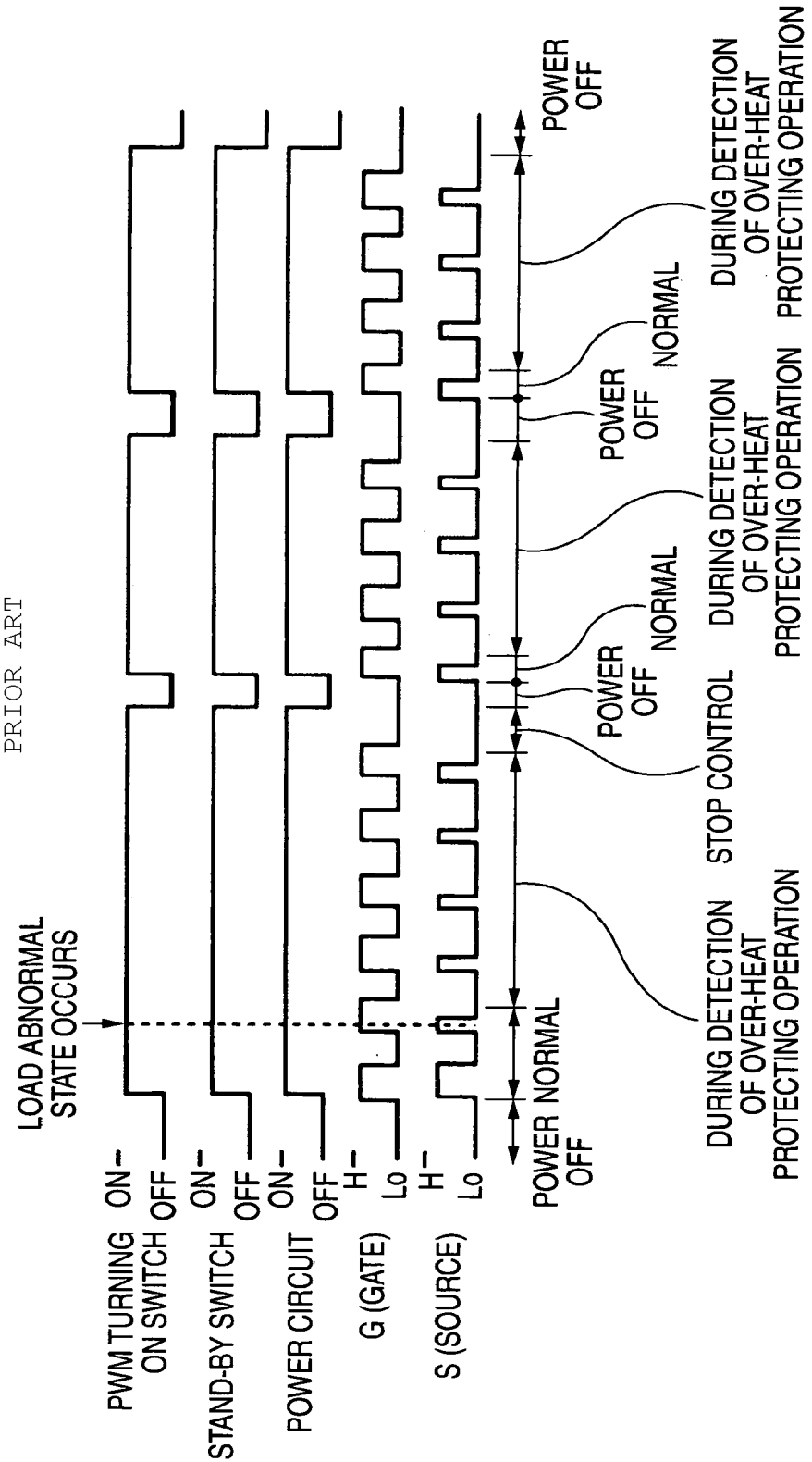
FIG. 8 is a timing chart for explaining a protecting operation of a MOSFET shown in FIG. 7.

Further, in this embodiment, an example is described that the MOSFET 81 of N ch is used, however, the present invention is not limited thereto. As shown in FIG. 5, a MOSFET 81a of P ch may be used. In this case, when a PWM input from an ECU 20 is low, the output of a gate driving circuit 60 is also low to turn on the MOSFET 81a.

In this case, a transistor Q8 of a power circuit 30 is provided in a ground side and the resistor Rs is provided in a side (a transistor Q2 side) to which a gate current IG is supplied.

The control circuit of the semiconductor device having the over-heat protecting function of the present invention can be applied to a control of an over-heat protection in a network mounted on a vehicle using, for instance, a CAN (Controller Area Network).

What is claimed is:

1. A control circuit of a semiconductor device having an over-heat protecting function, comprising:
    a semiconductor element which supplies an electric power from a power source to a load;
    an over-heat protecting unit for protecting an over-heat inside the semiconductor device, the over-heat protecting unit having:
        a temperature detecting section which detects a rise in temperature of the semiconductor device;
        a latch section which holds a detected output of the temperature detecting section; and
        a gate interrupting section which interrupts an input to a gate of the semiconductor element in accordance with the output of the latch section;
    a control unit which supplies a PWM signal for turning on/off the semiconductor element;
    a driving electric power supply unit which supplies a driving electric power for driving the over-heat protecting unit; and
    a timer unit which allows the driving electric power supply unit to supply the driving electric power for a predetermined period when the gate interrupting section interrupts the input to the gate of the semiconductor element and the control unit stops to supply the PWM signal to the semiconductor element.

2. The control circuit according to claim 1, further comprising:
    a current detecting section which detects a current supplied to the semiconductor element to output a current detecting signal when the value of the current exceeds a predetermined threshold value;
    a logic gate that outputs logical addition of the current detecting signal and the PWM signal; and
    a driving section which drives the semiconductor element in accordance with the logical addition output by the logic gate.

3. The control circuit according to claim 1, wherein the control unit supplies the PWM signal to the semiconductor element in accordance with a turning on/off operation of a switch.

4. The control circuit according to claim 1, wherein the semiconductor element and the over-heat protecting unit are formed on one chip.

* * * * *